United States Patent
Ewald et al.

(10) Patent No.: US 11,968,810 B2
(45) Date of Patent: Apr. 23, 2024

(54) POWER MODULE FOR OPERATING AN ELECTRIC VEHICLE DRIVE WITH A REDUCED LEAKAGE INDUCTANCE

(71) Applicant: ZF Friedrichshafen AG, Friedrichshafen (DE)

(72) Inventors: Ake Ewald, Bayreuth (DE); Michael Sperber, Bayreuth (DE); Stefan Hain, Speichersdorf (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 260 days.

(21) Appl. No.: 17/552,853

(22) Filed: Dec. 16, 2021

(65) Prior Publication Data
US 2022/0201903 A1 Jun. 23, 2022

(30) Foreign Application Priority Data
Dec. 18, 2020 (DE) .......................... 102020216318.9

(51) Int. Cl.
*H05K 7/20* (2006.01)
*B60L 53/22* (2019.01)
*B60L 53/24* (2019.01)

(52) U.S. Cl.
CPC .......... *H05K 7/20854* (2013.01); *B60L 53/22* (2019.02); *H05K 7/209* (2013.01)

(58) Field of Classification Search
CPC ..... H05K 7/20854; H05K 7/209; B60L 53/22
See application file for complete search history.

(56) References Cited

U.S. PATENT DOCUMENTS

| | | | |
|---|---|---|---|
| 2011/0051371 A1* | 3/2011 | Azuma | B60W 10/08 361/699 |
| 2022/0095493 A1* | 3/2022 | Blanchard St-Jacques | H05K 1/0231 |
| 2022/0149752 A1* | 5/2022 | Trenz | H01L 25/072 |
| 2022/0311349 A1* | 9/2022 | Pahn | H02G 5/02 |

(Continued)

FOREIGN PATENT DOCUMENTS

| | | | | |
|---|---|---|---|---|
| CN | 116582017 A | * | 8/2023 | ............ H02M 1/327 |
| EP | 2101402 A2 | * | 9/2009 | ............ B60L 15/007 |
| JP | 2009219270 A | * | 9/2009 | ............ B60L 15/007 |

OTHER PUBLICATIONS

Office Action dated Jul. 15, 2021 for German Patent Application No. 10 2020 216 318.9, (12 pp.), note: pp. 1 and 2 are English language Explanations to Section C. Result of Determination Document.

*Primary Examiner* — Sisay G Tiku
(74) *Attorney, Agent, or Firm* — Crowell & Moring LLP

(57) ABSTRACT

A power module for operating an electric vehicle drive may include one or more of the following: a plurality of semiconductor components; an intermediate circuit capacitor connected in parallel to the semiconductor components; a heatsink for the removal of heat generated by the semiconductor components, where the heatsink is located between the semiconductor components and the intermediate circuit capacitor; and an intermediate circuit line that electrically connects the intermediate circuit capacitor to the semiconductor components. The intermediate circuit line may extend perpendicular to a direction of flow for the coolant in the heatsink on a side of the semiconductor components facing away from the heatsink.

16 Claims, 6 Drawing Sheets

(56) References Cited

U.S. PATENT DOCUMENTS

| | | | |
|---|---|---|---|
| 2022/0393615 A1* | 12/2022 | Wang | H02M 7/003 |
| 2023/0301008 A1* | 9/2023 | Hain | H05K 7/20 |
| | | | 361/688 |

* cited by examiner

POWER MODULE FOR OPERATING AN ELECTRIC VEHICLE DRIVE WITH A REDUCED LEAKAGE INDUCTANCE

RELATED APPLICATION

This application claims the benefit of, and priority to, German Patent Application DE 10 2020 216 318.9, filed Dec. 18, 2020, which is hereby incorporated by reference herein in its entirety.

TECHNICAL FIELD

The present disclosure relates to the field of electromobility, in particular the power modules for operating an electric drive in a vehicle.

BACKGROUND

Power modules, in particular integrated power modules, are increasingly used in motor vehicles. These power modules are used, for example, in DC/AC inverters that supply electric motors with a multiphase alternating current. A direct current generated by a DC power source such as a battery is converted for this into a multiphase alternating current. The power modules are based on power semiconductors, in particular transistors such as IGBTs, MOSFETs, and HEMTs. Other fields of use are DC/DC transformers and AC/DC converters and transformers.

Power switches are normally formed by the power semiconductors, which are used in a bridge circuit. A frequent example is the so-called half-bridge, which comprises a high-side component and a low-side component. The high-side and low-side components each comprise one or more power switches, specifically high-side power switches and low-side power switches. With a targeted switching of the high-side and low-side power switches, the direction of the current generated at the output of the power module (output current) can be altered between a positive current and negative current very quickly. This enables a so-called pulse-width modulation for generating an alternating current, in the case of a DC/AC inverter, using a direct current input to the power module.

In view of this background, certain embodiments described herein include a power module with a reduced leakage inductance and improved switching behavior.

BRIEF DESCRIPTION OF THE DRAWINGS

Embodiments shall described below, merely by way of example, and in reference to the attached drawings. Therein.

Identical reference symbols in the drawing refer to the same or functionally similar elements.

DETAILED DESCRIPTION

Figure 1:
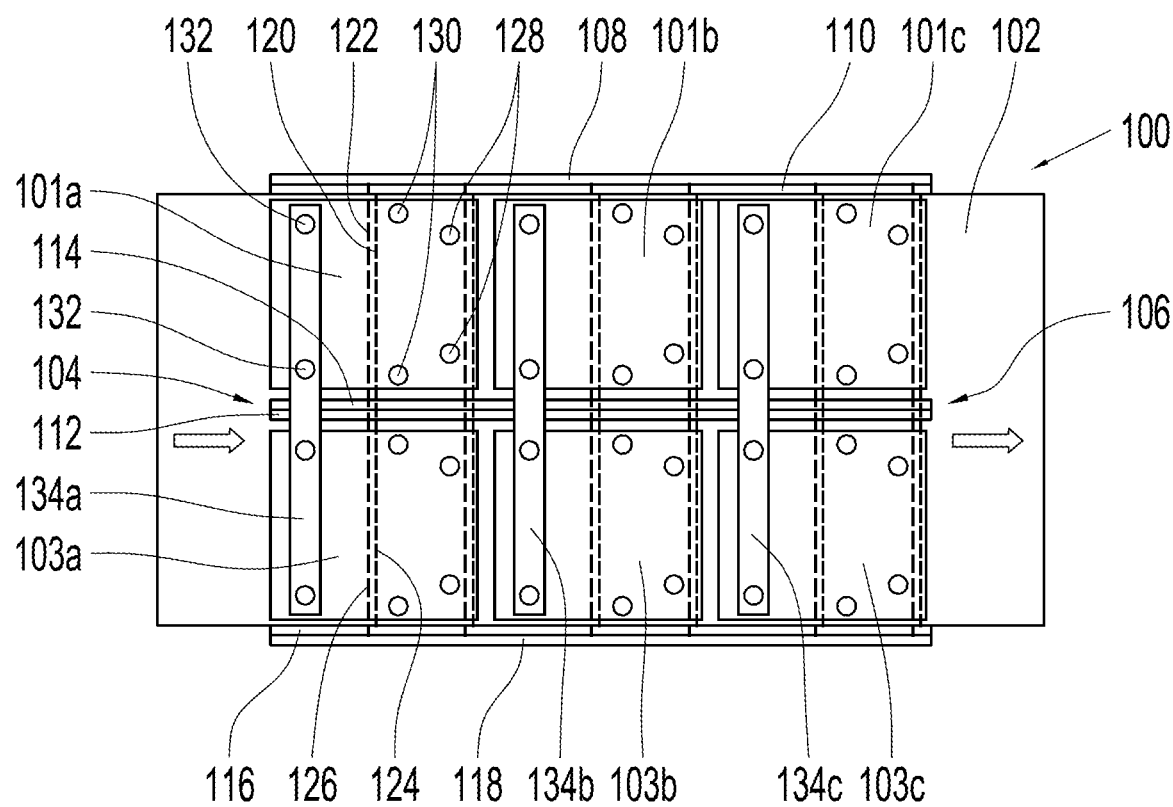
FIG. 1 shows a schematic illustration of a power module according to one embodiment.

In view of the background discussed above, an improved power module is discussed herein. Notably, the features described below may be optional, and variations of the power module are also contemplated. The power module is used to operate an electric drive in a vehicle, in particular an electric vehicle and/or hybrid vehicle. The power module is preferably used in a DC/AC inverter. In particular, the power module is used to provide electricity to an electric motor and/or generator. A DC/AC inverter is used to generate a multiphase alternating current from a direct current generated from a DC voltage from a power source, e.g. a battery.

The power module contains numerous semiconductor components or chips for generating an output current from the input current by controlling the individual semiconductor components. The semiconductor components are controlled by a control electronics, which contains one or more printed circuit boards populated with numerous electronic components. The control electronics preferably comprises a controller for generating a control signal on the basis of an operating state of the power module and a driver component for controlling the power switches on the basis of the control signal. The control can be based on so-called pulse-width modulation. With an inverter, the input current is a direct current, and the output current is an alternating current.

When the power module is in operation, strong currents are frequently sent through the individual semiconductor components. This is the case in particular with high power applications such as 400V and 800V applications. For this reason, it is important that the heat generated when the power module is in operation be discharged so that the semiconductor component is not damaged by overheating. A heatsink is normally used for this, to which the semiconductor components are thermally coupled.

The individual semiconductor components are normally combined to form so-called topological switches. Each topological switch contains numerous semiconductor components connected in parallel. As the demand for more power from an electric drive increases, so does the current that is to be provided by the power module. With a voltage that remains the same or increases, this requires a scaling of the number of topographic switches.

With the power modules known from the prior art, an increase in the number of topological switches results in contact with only a certain number of the various semiconductor components at the DC-side, in order to keep the leakage inductance low due to the impedance of the lines. Furthermore, the lengths of the lines in these known power modules frequently differ, resulting in different leakage inductances. Leakage inductances may occur with quick switching, resulting in voltage jumps that may exceed the overvoltages of the semiconductor components, thus damaging them.

An object of certain embodiments is therefore to effectively combat the voltage jumps caused by leakage inductances in a power module.

The power module is used to operate an electric drive in a vehicle, in particular an electric vehicle and/or hybrid vehicle. The power module is preferably used in a DC/AC inverter. The power module is used in particular to supply electricity to an electric motor and/or generator. A DC/AC inverter is used to generate a multiphase alternating current from a DC current generated by means of a DC voltage from an energy source, e.g. a battery.

The power module contains numerous semiconductor components or chips, which are used to generate an output current by controlling the individual semiconductor switches on the basis of the input current. The topological switches are controlled by a control electronics that preferably contains one or more printed circuit boards populated with numerous electronic components. The control electronics preferably comprises a controller for generating a control signal on the basis of an operating state of the power module, and a driver component for controlling the semiconductor components on the basis of the control signal. The control can be based on so-called pulse-width modulation. The input current in an inverter is a direct current, and the output current is an alternating current.

The numerous semiconductor components preferably form one or more half-bridges. The half-bridges comprise a high-side, and low-side connected in series to the high-side. The high-side and low-side each comprise a topological switch with numerous semiconductor components connected in parallel. The semiconductor components each comprise an IGBT, MOSFET, or HEMT. The fundamental semiconductor material for the respective semiconductor components preferably comprises a so-called wide-bandgap semiconductor (a semiconductor with a wide bandgap) such as silicon carbide (SiC) or gallium nitride (GaN), and/or it can comprise crystalline and/or amorphous silicon.

The power module also comprises a heatsink, to which the semiconductor components are thermally coupled. Cooling channels are preferably formed in the heatsink through which a coolant such as water flows. The power module also comprises an intermediate circuit capacitor connected in parallel to the semiconductor components for smoothing the input voltage. The heatsink is located between the semiconductor components and the intermediate circuit capacitor.

There is an intermediate circuit line comprising numerous busbars for electrically connecting the intermediate circuit capacitor to the semiconductor components. The intermediate circuit line extends perpendicular to a direction of flow for a coolant in the heatsink from a side of the semiconductor components facing away from the heatsink.

This makes it easier to connect the semiconductor components inside the power module to the power input, e.g. the DC input on the power module. This makes it easier to scale the power transmission capacity of the power module. The leakage inductance of the power module can also be reduced, such that the probability of voltage jumps at the semiconductor components, which can be attributed to the coupling between the leakage inductance and the changes in current caused by switching the semiconductor components, is reduced.

FIG. 1 shows a schematic illustration of a power module 100 in a top view. The power module 100 comprises a heatsink 102, which comprises an intake 104 and an outlet 106. The heatsink 102 contains a coolant, the directions of flow for which are indicated by two arrows. There are numerous semiconductor components above the heatsink 102, forming six half-bridges 101a-c, 103a-c, by way of example in this case. These half-bridges 101a-c, 103a-c are each assigned one of three phases. The three half-bridges 101a and 103a on the left are assigned a first phase. The middle three half-bridges 101b, 103b are assigned a second phase. The three half-bridges 101c, 103c on the right are assigned a third phase. The semiconductor components can comprise IGBTs, MOSFETs and/or HEMTs. The semiconductor components can be based on one or more semiconductor materials, e.g. silicon, silicon carbide, gallium nitride. Each half-bridge 101a-c, 103a-c comprises a high-side and a low-side, each of which comprises numerous semiconductor components connected in parallel.

The power module 100 serving as an inverter has an input (not shown) for inputting an input current, and an output (not shown) for outputting an output current, which is generated by the control of the semiconductor components on the basis of the input current. The semiconductor components are connected at the DC-side to an intermediate circuit capacitor (not shown) by means of an intermediate circuit line. The intermediate circuit line comprises a positive pole and a negative pole. The positive pole comprises a first longitudinal line 108, a second longitudinal line 118, and a third longitudinal line 112, which extend parallel to the direction of flow of the coolant, in particular parallel to a line defined by the intake 104 and outlet 106. The negative pole comprises a first longitudinal line 110, a second longitudinal line 116 and a third longitudinal line 114, which extend parallel to the direction of flow of the coolant, in particular parallel to a line defined by the intake 104 and outlet 106. The first and second longitudinal lines 108, 110, 116, 118 are located in two opposite edge regions of the heatsink 102. The third longitudinal line 112, 114 is in a middle region of the heatsink 102, between the first half-bridges 101a-c and second half-bridges 103a-c.

The positive pole also contains numerous lateral lines 122, 126, and the negative pole also contains numerous lateral lines 120, 124. These lateral lines 120, 122, 124, 126 connect the third longitudinal lines 112, 114 to the first and second longitudinal lines 108, 110, 116, 118. As shown in FIG. 1, the half-bridges 101a-c, 103a-c are each assigned two such lateral lines for the positive pole and negative pole.

The individual semiconductor components are connected by positive electrical contacts 128 and negative electrical contacts 130 to the longitudinal lines 108, 110, 116, 118 and/or the lateral lines 120, 122, 124, 126. The electrical contacts 128, 130 are preferably located in an edge region of the half-bridges 101a-c, 103a-c, facilitating a simple connection with a limited line length and therefore lower leakage inductance.

The semiconductor components in the individual half-bridges 101a-c, 103a-c are electrically connected at the output-side to a power output 134a-c by means of numerous output contacts 132. The respective power outputs 134a-c for the individual phases is formed by a bar-shaped contact, which is applied to the output contact 132 from above.

Figure 2:
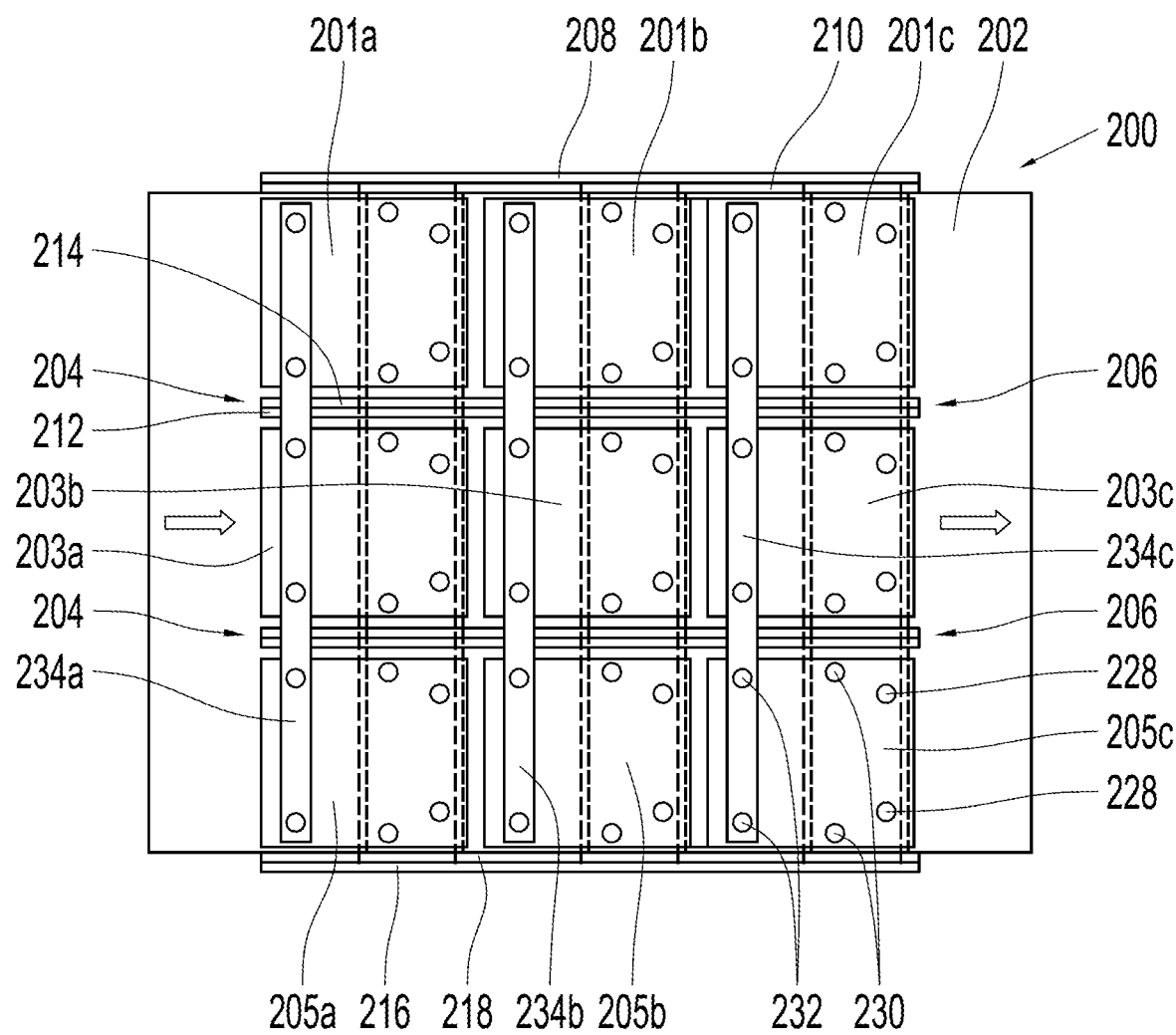
FIG. 2 shows a schematic illustration of a power module according to another embodiment.

FIG. 2 shows a schematic illustration of a power module 200 according to another embodiment. The power module 200 is substantially similar to the power module 100 shown in FIG. 1. The only difference between the two embodiments is that in the embodiment shown in FIG. 2, there are third half-bridges 205a, 205b, 205c, in addition to the first half-bridges 201a, 201b, 201c, and the second half-bridges 203a, 203b, 203c. Accordingly, there is an additional lateral line in the positive and negative poles for each phase, which extends laterally over the half-bridges 205a-c in the drawing plane.

Figure 3:
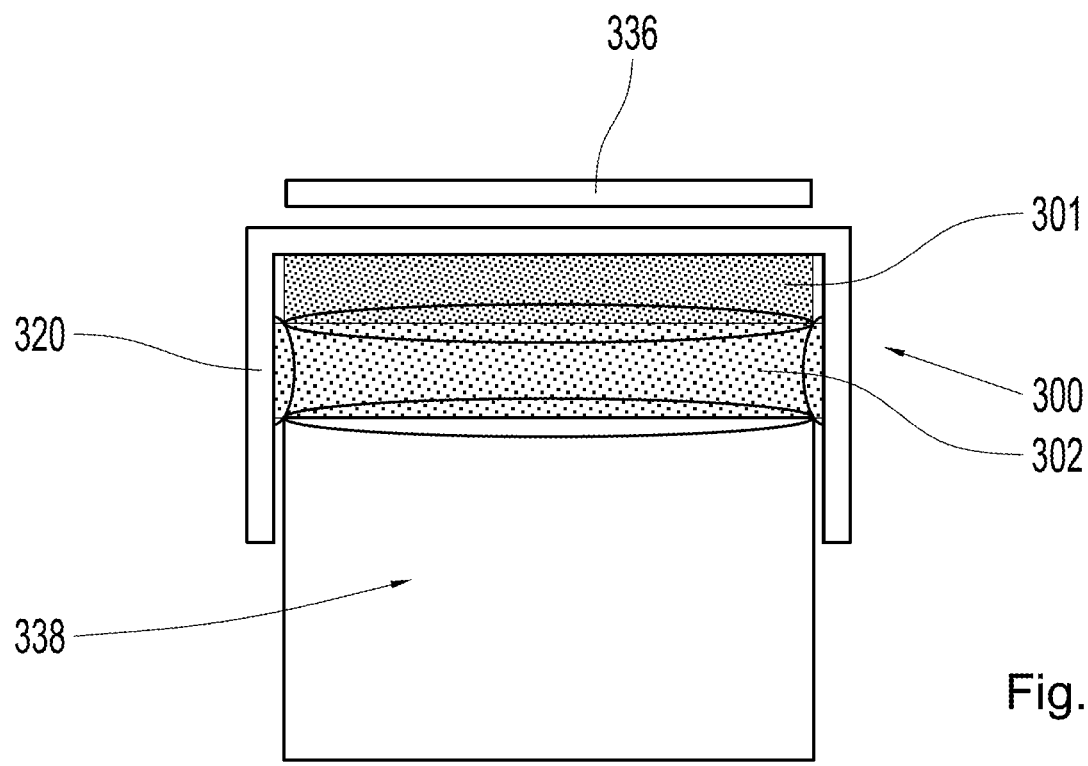
FIG. 3 shows a schematic illustration of a power module according to another embodiment.

FIG. 3 shows a cutaway view of a power module 300 according to another embodiment. Aside from a half-bridge 301, there is a heatsink 302 and an intermediate circuit line 320 for an intermediate circuit capacitor 338, which is located on a side of the heatsink 302 facing away from the half-bridge 302. The intermediate circuit line 320 extends on both sides of the layer from the intermediate circuit capacitor 338, the heatsink 302, the half-bridge 301 and between these and a controller board 336, which controls the semiconductor components in the half-bridge 301. This placement of the intermediate circuit line 320 is advantageous in that it enables a simple input connection to the semiconductor components.

Figure 4:
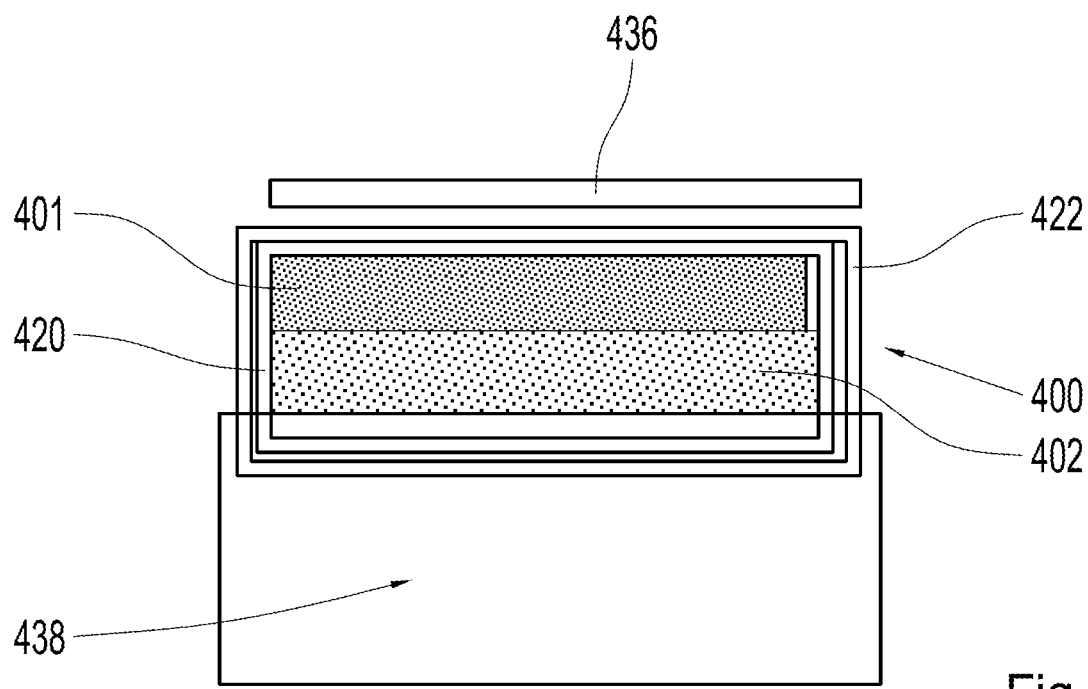
FIG. 4 shows a schematic illustration of a power module according to another embodiment.

FIG. 4 shows a schematic cutaway view of a power module 400 according to another embodiment. As with the embodiment in FIG. 3, this also contains a half-bridge 401, heatsink 402, intermediate circuit lines 420, 422, intermediate circuit capacitor 438, and a controller board 436. The intermediate circuit lines 420, 422 encompass the layer comprising the heatsink 402 and the half-bridge 401 in the cutting plane. This placement of the intermediate circuit lines 420, 422 is advantageous in that it enables a simple input-side connection to the semiconductor components.

Figure 5:
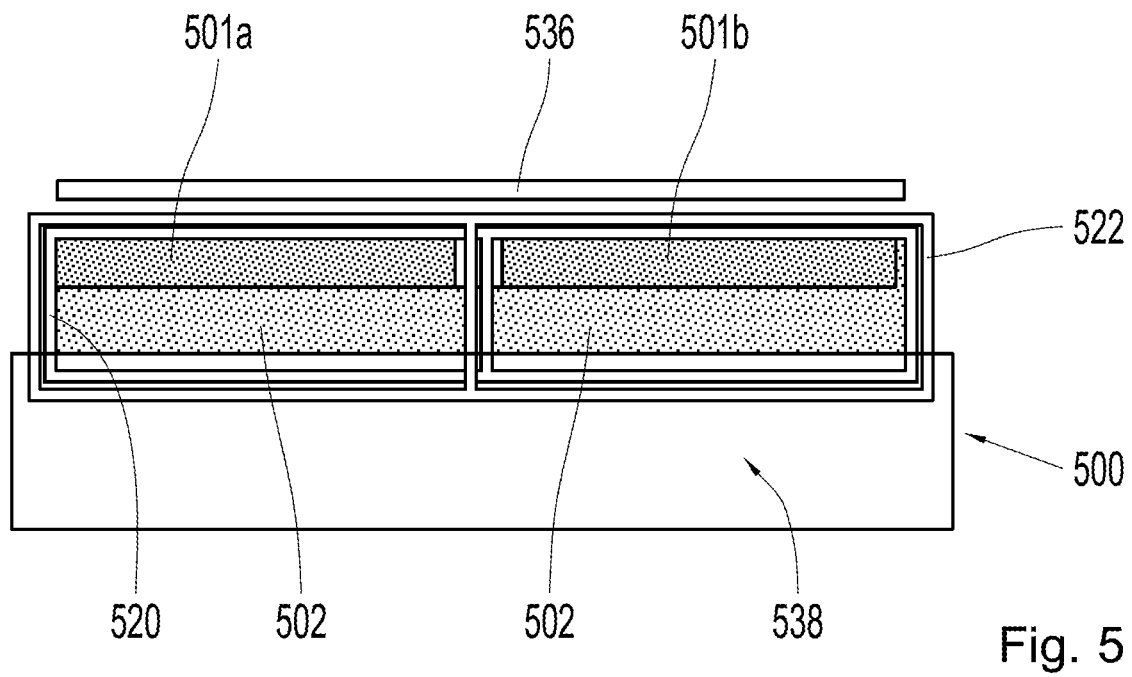
FIG. 5 shows a schematic illustration of a power module according to another embodiment.

FIG. 5 shows a cutaway view of a power module 500 according to another embodiment. As in FIG. 4, there are half-bridges 501a, 501b, a heatsink 502, an intermediate circuit line 520, 522, an intermediate circuit capacitor 538, and a controller board 536. The intermediate circuit lines 420, 422 comprise two loops here, each of which encompasses a layer composed of the heatsink 402 and the first half-bridge 501a, or second half-bridge 501b. This placement of the intermediate circuit lines 520, 522 is advantageous in that it enables a simple output connection to the semiconductor components.

Figure 6:
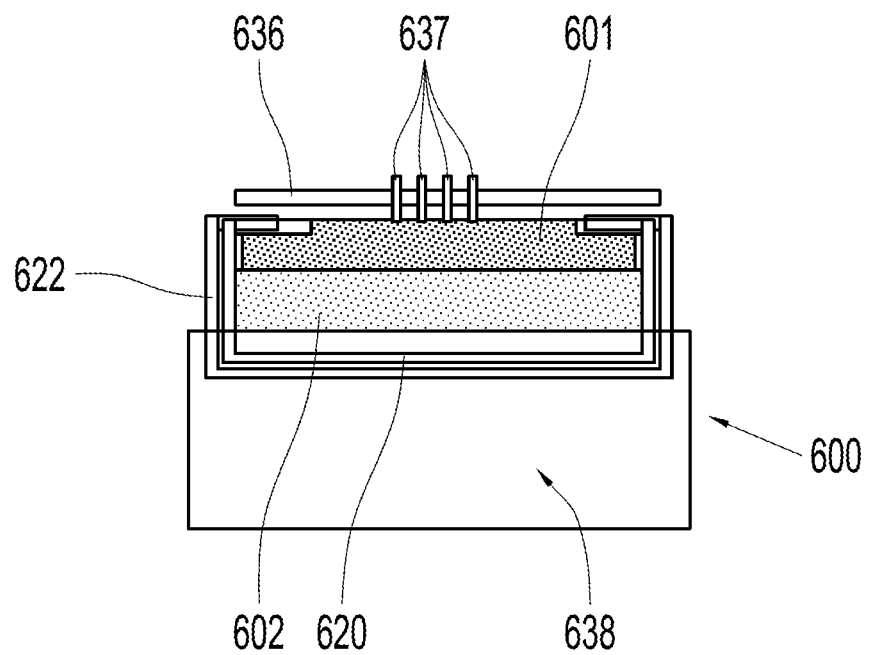
FIG. 6 shows a schematic illustration of a power module according to another embodiment.

FIG. 6 shows a cutaway view of a power module 600 according to another embodiment. As in FIG. 4, there is a half-bridge 601, a heatsink 602, an intermediate circuit line 620, 622, an intermediate circuit capacitor 638, and a controller board 636. The intermediate circuit lines 620, 622 extend on both-sides of the layer from the heatsink 602 and half-bridge 602. The intermediate circuit lines 620, 622 also extend between the intermediate circuit capacitor 638 and the heatsink 602. This placement of the intermediate circuit lines 520, 522 is advantageous in that it enables a simple connection to the semiconductor components. There are also numerous electric connections 637 for connecting the semiconductor components to the controller board.

Figure 7:
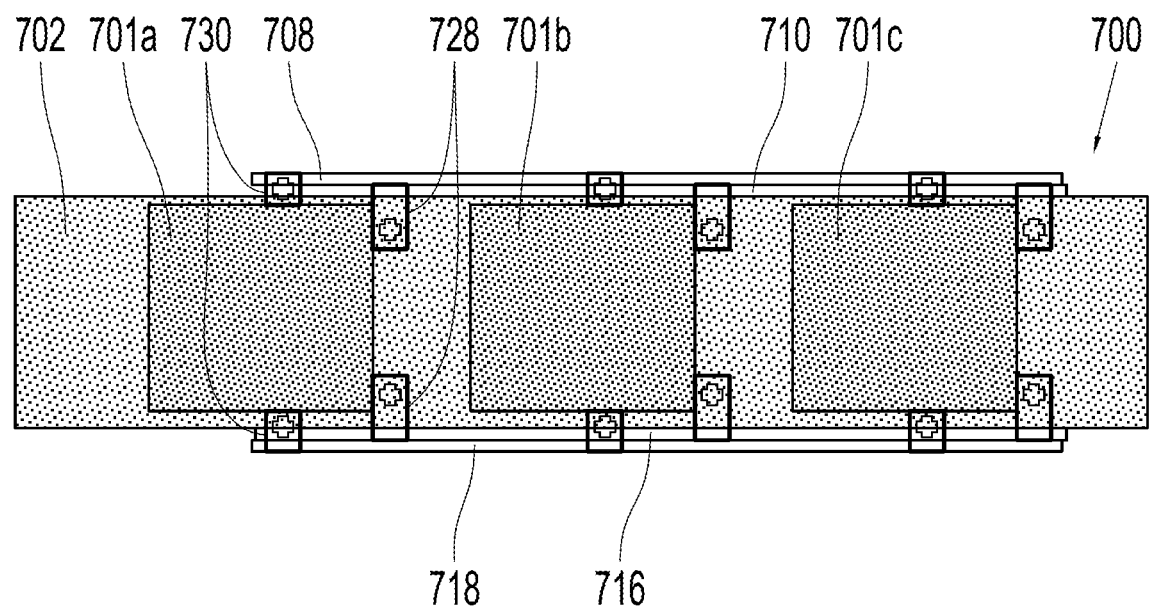
FIG. 7 shows a schematic illustration of a power module according to another embodiment.
Figure 8:
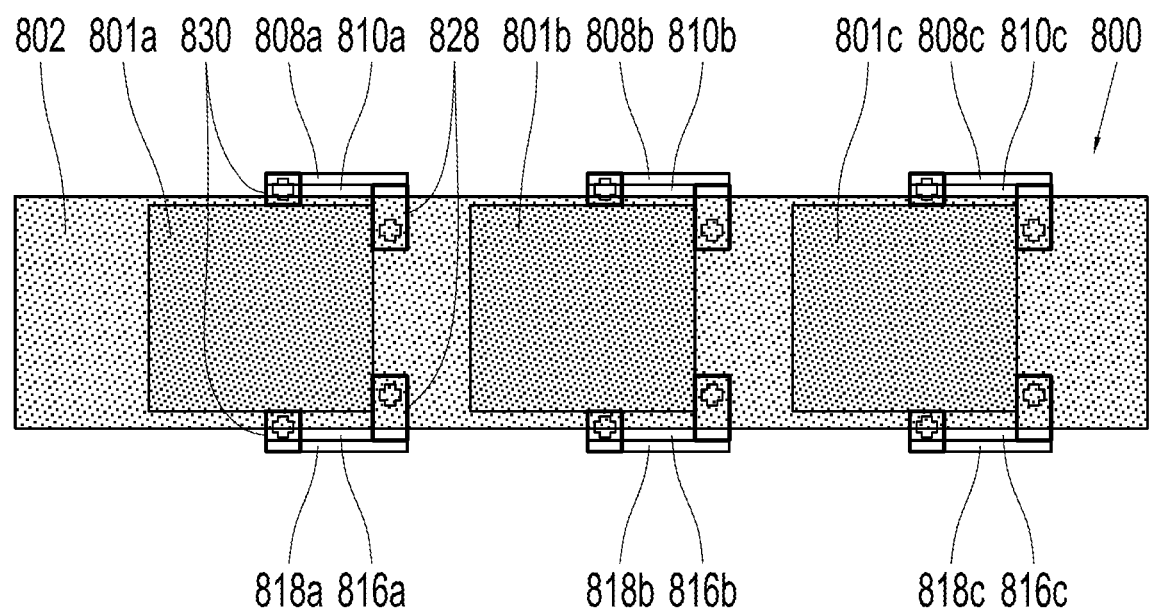
FIG. 8 shows a schematic illustration of a power module according to another embodiment.

FIGS. 7-8 each show a power module 700, 800 according to further embodiments. The power module 700 shown in FIG. 7 comprises a heatsink 702, numerous half-bridges 701a-c, an intermediate circuit line comprising first longitudinal lines 708, 710 and second longitudinal lines 718, 716, as well as numerous electrical contacts 728, 730. The electrical contacts 728, 730 are located in an edge region of the respective half-bridges 701a-c, and connect the semiconductor components contained in the respective half-bridges 701a-c with the longitudinal lines 708, 710, 716, 718. The power module 800 shown in FIG. 8 likewise comprises a heatsink 802, numerous half-bridges 801a-c, an intermediate circuit line comprising first longitudinal lines 808a-c, 810a-c, and second longitudinal lines 818a-c, 816a-c, as well as numerous electrical contacts 828, 830. The electrical contacts 828, 830 are located in an edge region of the respective half-bridges 801a-c and connect the semiconductor components contained in the respective half-bridges 801a-c with the longitudinal lines 808a-c, 810a-c, 816a-c, 818a-c. In differing from the longitudinal lines 708, 710, 716, 718 shown in FIG. 7, the longitudinal lines in the embodiment shown in FIG. 8 each comprise numerous spaced apart segments, and each of these segments is assigned one of the numerous phases. In this manner, a material reduction can be obtained with the same connection simplicity.

Figure 9:
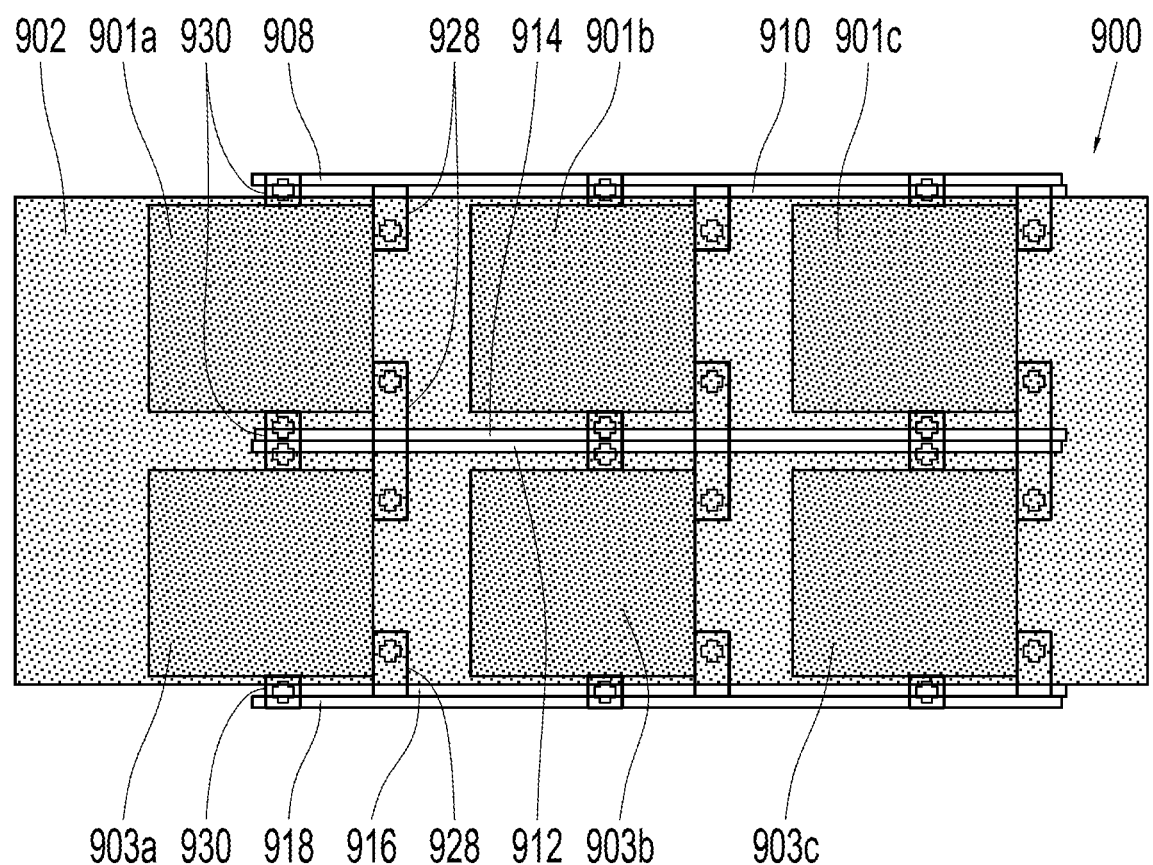
FIG. 9 shows a schematic illustration of a power module according to another embodiment.

FIG. 9 shows, schematically, another power module 900, which comprises a heatsink 902, numerous first half-bridges 901a-c and second half-bridges 903a-c, an intermediate circuit line comprising first longitudinal lines 908, 910, second longitudinal lines 918, 916 and third longitudinal lines 912, 914 between the first half-bridges 901a-c and the second half-bridges 903a-c, as well as numerous electrical contacts 928, 930. The power module 900 in FIG. 9 is therefore substantially similar to the power module 100 in FIG. 1. The difference to the power module 100 in FIG. 1 is that an electrical contact 928, 930 assigned to the first half-bridge 901a is integrally formed with an electrical contact 928, 930 assigned to the second half-bridge 903a.

REFERENCE SYMBOLS 100, 200, 300, 400, 500, 600, 700, 800, 900: power module
101a-c, 103a-c, 201a-c, 203a-c, 205a-c, 301: half-bridges
401, 501, 601, 701a-c, 801a-c, 901a-c, 903a-c: half-bridges
102, 202, 302, 402, 502, 602, 702, 802, 902: heat sink
104, 204: intake
106, 206: outlet
108, 110, 208, 210, 708, 710, 801a-c, 810a-c, 908, 910: first longitudinal lines
116, 118, 216, 218, 716, 718, 816a-c, 818a-c, 916, 918: second longitudinal lines
112, 114, 212, 214, 912, 914: third longitudinal line
120, 122, 124, 126: lateral line
128, 130, 228, 230, 728, 730, 828, 830, 928, 930: electrical contacts
132, 232: output contact
134a-c, 234a-c: power outputs
320, 420, 520, 522, 620, 622: intermediate circuit line
336, 436, 636, 636: controller board
637: electrical connections
338, 438, 538, 638: intermediate circuit capacitor

We claim:
1. A power module for operating an electric vehicle drive, comprising:
   a plurality of semiconductor components;
   an intermediate circuit capacitor connected in parallel to the semiconductor components;
   a heatsink for a removal of heat generated by the semiconductor components, wherein the heatsink is located between the semiconductor components and the intermediate circuit capacitor; and
   an intermediate circuit line that electrically connects the intermediate circuit capacitor to the semiconductor components,
   wherein a first portion of the intermediate circuit line extends perpendicular to a direction of flow for a coolant in the heatsink on a first side of the semiconductor components, and the first side of the semiconductor components faces away from the heatsink,
   wherein a second portion of the intermediate circuit line extends perpendicular to the flow of the coolant in the heatsink on a first side of the heatsink, and the first side of the heatsink faces away from the semiconductor components, and
   wherein the intermediate circuit line forms a loop that at least partially encompasses a portion of the semiconductor components and a segment assigned to this portion of the semiconductor components.
2. The power module according to claim 1, wherein the semiconductor components comprise a plurality of first halfbridges, each of which is assigned to one of a plurality of phases, wherein the first halfbridges are placed such that they are parallel to the direction of flow for the coolant.

3. The power module according to claim 2, wherein, in addition to the first halfbridges, the semiconductor components contain a second halfbridge, which is connected in parallel to the first halfbridge, wherein the first halfbridge and second halfbridge are perpendicular to the direction of flow for the coolant.

4. The power module according to claim 3, wherein, in addition to the first halfbridges, the semiconductor components have a third halfbridge, which is connected in parallel to the first and second halfbridges, wherein the first halfbridges, second halfbridges and third halfbridges are perpendicular to the direction of flow for the coolant.

5. The power module according to claim 4, wherein at least a third contact is located in an edge region of the third halfbridge, which electrically connects one or more of the semiconductor components in the third halfbridge to the intermediate circuit line.

6. The power module according to claim 3, wherein at least one second contact is located in an edge region of the second halfbridge, which electrically connects one or more of the semiconductor components in the second halfbridge to the intermediate circuit line.

7. The power module according to claim 2, wherein at least one first contact is located in an edge region of the first halfbridge, which electrically connects one or more of the semiconductor components in the first halfbridge to the intermediate circuit line.

8. The power module according to claim 1, wherein the semiconductor components have at least two halfbridges perpendicular to the direction of flow for the coolant, wherein there is a contact in an edge region of the two halfbridges, which electrically connects the two halfbridges with the intermediate circuit line.

9. An inverter, comprising:
a power module for operating an electric vehicle drive, wherein the power module includes a plurality of semiconductor components,
wherein the power module includes an intermediate circuit capacitor connected in parallel to the semiconductor components,
wherein the power module includes a heatsink for a removal of heat generated by the semiconductor components, wherein the heatsink is located between the semiconductor components and the intermediate circuit capacitor,
wherein the power module includes an intermediate circuit line that electrically connects the intermediate circuit capacitor to the semiconductor components,
wherein a first portion of the intermediate circuit line extends perpendicular to a direction of flow for a coolant in the heatsink on a first side of the semiconductor components, and the first side of the semiconductor components faces away from the heatsink,
wherein a second portion of the intermediate circuit line extends perpendicular to the flow of the coolant in the heatsink on a first side of the heatsink, and the first side of the heatsink faces away from the semiconductor components, and
wherein the intermediate circuit line forms a loop that at least partially encompasses a portion of the semiconductor components and a segment assigned to this portion of the semiconductor components.

10. The inverter according to claim 9, wherein the semiconductor components comprise a plurality of first halfbridges, each of which is assigned to one of a plurality of phases, wherein the first halfbridges are placed such that they are parallel to the direction of flow for the coolant.

11. The inverter according to claim 10, wherein, in addition to the first halfbridges, the semiconductor components contain a second halfbridge, which is connected in parallel to the first halfbridge, wherein the first halfbridge and second halfbridge are perpendicular to the direction of flow for the coolant.

12. The inverter according to claim 11, wherein, in addition to the first halfbridges, the semiconductor components have a third halfbridge, which is connected in parallel to the first and second halfbridges, wherein the first halfbridges, second halfbridges and third halfbridges are perpendicular to the direction of flow for the coolant.

13. The inverter according to claim 12, wherein at least a third contact is located in an edge region of the third halfbridge, which electrically connects one or more of the semiconductor components in the third halfbridge to the intermediate circuit line.

14. The inverter according to claim 10, wherein at least one first contact is located in an edge region of the first halfbridge, which electrically connects one or more of the semiconductor components in the first halfbridge to the intermediate circuit line.

15. The inverter according to claim 11, wherein at least one second contact is located in an edge region of the second halfbridge, which electrically connects one or more of the semiconductor components in the second halfbridge to the intermediate circuit line.

16. The inverter according to claim 9, wherein the semiconductor components have at least two halfbridges perpendicular to the direction of flow for the coolant, wherein there is a contact in an edge region of the two halfbridges, which electrically connects the two halfbridges with the intermediate circuit line.

\* \* \* \* \*